US012375093B2

(12) United States Patent
Chung et al.

(10) Patent No.: US 12,375,093 B2
(45) Date of Patent: Jul. 29, 2025

(54) DEADLOCK RECOVERY CIRCUIT AND DEADLOCK RECOVERY METHOD, AND PLL CIRCUIT INCLUDING THE SAME

(71) Applicant: Magnachip Semiconductor, Ltd., Cheongju-si (KR)

(72) Inventors: Chel Ho Chung, Cheongju-si (KR); Gil Sung Roh, Cheongju-si (KR)

(73) Assignee: MAGNACHIP MIXED-SIGNAL, LTD., Cheongju-si (KR)

( * ) Notice: Subject to any disclaimer, the term of this patent is extended or adjusted under 35 U.S.C. 154(b) by 63 days.

(21) Appl. No.: 18/388,203

(22) Filed: Nov. 9, 2023

(65) Prior Publication Data

US 2024/0235562 A1  Jul. 11, 2024

(30) Foreign Application Priority Data

Jan. 5, 2023  (KR) .................. 10-2023-0001552

(51) Int. Cl.
*H03L 7/099* (2006.01)
*H03L 7/10* (2006.01)
*H03L 7/24* (2006.01)

(52) U.S. Cl.
CPC ............ *H03L 7/0992* (2013.01); *H03L 7/101* (2013.01); *H03L 7/24* (2013.01)

(58) Field of Classification Search
CPC ......... H03L 7/0992; H03L 7/101; H03L 7/24; H03L 7/095; H03L 7/099
See application file for complete search history.

(56) References Cited

U.S. PATENT DOCUMENTS

| | | | | |
|---|---|---|---|---|
| 4,187,394 A | * | 2/1980 | Sievers ................ | H04L 5/1423 370/282 |
| 4,255,617 A | * | 3/1981 | Carau, Sr. ............ | G06F 3/0442 341/5 |
| 4,881,196 A | * | 11/1989 | Terada .................. | H04J 3/08 712/233 |
| 5,590,157 A | * | 12/1996 | Schuur ................ | H04L 27/2335 331/25 |
| 6,040,743 A | * | 3/2000 | Bjorklid .............. | H03L 7/099 327/280 |
| 6,717,460 B2 | * | 4/2004 | Yamauchi ............ | G11C 7/20 327/333 |

(Continued)

FOREIGN PATENT DOCUMENTS

| | | | | |
|---|---|---|---|---|
| CN | 101160566 A | * | 4/2008 | ......... G06F 13/1605 |
| CN | 102088470 A | * | 6/2011 | ............ H04L 43/00 |

(Continued)

*Primary Examiner* — Berhanu Tadese
(74) *Attorney, Agent, or Firm* — POLSINELLI PC (57) ABSTRACT

The present disclosure relates to a deadlock recovery unit for applying a one-shot pulse signal to restart a Voltage Controlled Oscillator (VCO) when the output clock signal of the VCO remains in a high state or a low state. The deadlock recovery unit includes a VCO clock monitoring unit for monitoring a clock signal of a voltage control oscillator; a pulse signal generating unit for outputting a one-shot pulse signal to reset the VCO when a clock signal is not counted; and a control signal generating unit for generating a VCO counter enable signal applied to the VCO clock monitoring unit and a detector clock signal applied to the pulse signal generating unit by using an externally supplied reference clock signal.

20 Claims, 5 Drawing Sheets

(56) References Cited

U.S. PATENT DOCUMENTS

| | | | |
|---|---|---|---|
| 6,853,254 B2 * | 2/2005 | Li | H03L 7/0896 331/25 |
| 7,159,134 B2 * | 1/2007 | Soerensen | G06F 1/3203 713/320 |
| 7,315,956 B2 * | 1/2008 | Jensen | H03L 7/183 713/503 |
| 7,323,943 B2 * | 1/2008 | Kaneko | H03L 7/095 331/12 |
| 7,698,590 B2 * | 4/2010 | Jensen | G06F 1/3203 713/400 |
| 7,746,132 B2 * | 6/2010 | Okamoto | H03L 7/085 327/147 |
| 7,843,762 B2 * | 11/2010 | Okada | G06F 13/1605 365/233.14 |
| 7,898,305 B2 * | 3/2011 | Okamoto | H03L 7/099 327/147 |
| 8,156,366 B2 * | 4/2012 | Jensen | G06F 1/324 713/502 |
| 8,183,934 B2 * | 5/2012 | Yamabana | H03L 7/099 331/10 |
| 8,970,312 B2 * | 3/2015 | Maruko | H03K 3/0322 331/57 |
| 9,042,222 B2 * | 5/2015 | Kwan | H04L 47/266 370/230 |
| 9,490,824 B1 * | 11/2016 | Singh | H03L 7/089 |
| 9,977,745 B2 * | 5/2018 | Florea | H04L 49/3027 |
| 10,331,569 B2 * | 6/2019 | Florea | G06F 12/10 |
| 10,891,179 B2 * | 1/2021 | Sundrani | G06F 11/1443 |
| 2004/0124936 A1 * | 7/2004 | Li | H03L 7/0898 331/160 |
| 2005/0243058 A1 * | 11/2005 | Morris | H04W 52/04 345/158 |
| 2005/0243059 A1 * | 11/2005 | Morris | H04W 52/04 345/158 |
| 2006/0035590 A1 * | 2/2006 | Morris | H04W 52/28 710/1 |
| 2006/0114067 A1 * | 6/2006 | Kaneko | H03L 7/18 331/12 |
| 2011/0115531 A1 * | 5/2011 | Okamoto | H03L 7/1976 327/117 |
| 2014/0146666 A1 * | 5/2014 | Kwan | H04L 47/12 370/230 |
| 2017/0085270 A1 * | 3/2017 | Suzuki | H03B 5/32 |
| 2019/0020586 A1 * | 1/2019 | Karanam | H04L 49/109 |
| 2024/0235562 A1 * | 7/2024 | Chung | H03L 7/24 |

FOREIGN PATENT DOCUMENTS

| | | | | |
|---|---|---|---|---|
| CN | 101160566 B | * | 3/2012 | G06F 13/1605 |
| CN | 102545782 A | * | 7/2012 | H03B 5/364 |
| CN | 102088470 B | * | 3/2014 | H04L 43/00 |
| CN | 102545782 B | * | 4/2016 | H03B 5/364 |
| CN | 105871335 A | * | 8/2016 | H03B 5/364 |
| CN | 207833491 U | * | 9/2018 | |
| CN | 105871335 B | * | 12/2018 | H03B 5/364 |
| CN | 109617529 A | * | 4/2019 | H03B 5/364 |
| CN | 111858448 A | * | 10/2020 | G06F 13/4282 |
| CN | 116185504 A | * | 5/2023 | G06F 9/4418 |
| CN | 116627665 A | * | 8/2023 | G06F 9/526 |
| CN | 117221163 A | * | 12/2023 | |
| EP | 0627829 A1 | * | 12/1994 | H04L 27/2335 |
| EP | 0627829 B1 | * | 9/2001 | H04L 27/2335 |
| EP | 1662663 A1 | * | 5/2006 | H03L 7/105 |
| EP | 1662663 B1 | * | 8/2008 | H03L 7/105 |
| JP | H0673124 B2 | | 9/1994 | |
| JP | H06338916 A | * | 12/1994 | H04L 7/033 |
| JP | H07334392 A | * | 12/1995 | |
| JP | H10107627 A | * | 4/1998 | |
| JP | 11103249 A | * | 4/1999 | |
| JP | 1999103249 | * | 4/1999 | H03L 7/093 |
| JP | H11122102 A | * | 4/1999 | |
| JP | 2002246904 A | * | 8/2002 | H03L 7/1072 |
| JP | 2003018004 A | * | 1/2003 | |
| JP | 2003124807 A | * | 4/2003 | |
| JP | 2003133935 A | * | 5/2003 | G11C 5/14 |
| JP | 3850264 B2 | * | 11/2006 | G11C 5/14 |
| JP | WO2007018043 A1 | * | 2/2009 | G06F 13/1605 |
| JP | 2010124102 A | * | 6/2010 | |
| JP | 5000514 B2 | * | 8/2012 | G06F 13/1605 |
| JP | 2012186784 A | * | 9/2012 | H02H 7/20 |
| JP | 5139958 B2 | * | 2/2013 | H03L 7/099 |
| JP | 2016012944 A | * | 1/2016 | |
| JP | 6141383 B2 | * | 6/2017 | H03B 5/32 |
| JP | 2017139810 A | * | 8/2017 | H03B 5/35 |
| JP | 6408064 B2 | * | 10/2018 | H03B 5/32 |
| KR | 20030035833 A | * | 5/2003 | G11C 7/20 |
| KR | 100467252 B1 | * | 1/2005 | G11C 5/14 |
| KR | 20240109707 A | * | 7/2024 | H03L 7/099 |
| SU | 1034042 A1 | * | 8/1983 | |
| SU | 1043651 A1 | * | 9/1983 | |
| SU | 1179340 A1 | * | 9/1985 | |
| SU | 1735851 A1 | * | 5/1992 | |
| WO | WO-2007018043 A1 | * | 2/2007 | G06F 13/1605 |
| WO | WO-2024080395 A1 | * | 4/2024 | G06F 13/40 |

* cited by examiner

DEADLOCK RECOVERY CIRCUIT AND DEADLOCK RECOVERY METHOD, AND PLL CIRCUIT INCLUDING THE SAME

CROSS-REFERENCE TO RELATED APPLICATION

This application claims the priority of Korean Patent Application No. 10-2023-0001552 filed on Jan. 5, 2023, which is hereby incorporated by reference in its entirety.

BACKGROUND

Field of the Disclosure

The present disclosure relates to a deadlock recovery circuit and a deadlock recovery method, and a PLL circuit including the same and in particular to a deadlock recovery circuit and a deadlock recovery method that rapidly re-operates a voltage controlled oscillator (VCO) equipped in a phase locked loop (PLL) circuit when the VCO output is in an abnormal operating condition that remains either in a high state or a low state, which is referred to as deadlock.

Description of the Background

A Phase Locked Loop (PLL) circuit refers to a circuit that generates a waveform with a specific periodicity according to the requirements of the system. In other words, the PLL circuit locks the phase of periodic signals accurately to the desired frequency using a reference frequency. Various types of PLL circuits are utilized.

When external shocks such as ESD are introduced to the PLL circuit, a problem occurs where the voltage controlled oscillator (VCO), which is supposed to output a specific frequency based on the input voltage, abnormally stops operating.

In other words, the VCO should generate a frequency proportional to the voltage, but it enters a deadlock state where the output frequency remains in a high or low state continuously. This is also referred to as being stuck.

In general, the VCO may include a plurality of inverters (A, B, C, . . . ). If the output of A inverter is in a high state, the output of B inverter or the output of C inverter should be in the opposite low state.

However, if external shocks such as ESD are applied to the PLL circuit, the VCO may have both the outputs of B and C inverters in either a high state or a low state due to these causes. As a result, the VCO enters a state where it cannot output a clock signal properly, and consequently, the PLL circuit itself becomes unable to generate a frequency.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a deadlock recovery circuit and a deadlock recovery method, and a PLL circuit including the same that substantially obviate one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a deadlock recovery circuit includes a voltage controlled oscillator (VCO) clock monitoring unit configured to monitor a clock signal of a VCO; a pulse signal generating unit configured to output a one-shot pulse signal to reset the VCO if the clock signal is not counted; and a control signal generating unit configured to control the VCO clock monitoring unit and the pulse signal generating unit using a reference clock signal externally supplied.

The VCO clock monitoring unit may be controlled by a VCO counter enable signal generated from the control signal generating unit.

The VCO clock monitoring unit may include: a first flip-flop for counting a clock signal of the VCO; and a second flip-flop for outputting a logic signal according to an output signal of the first flip-flop. The second flip-flop, while the VCO counter enable signal is in a high state, may output a low signal when the clock signal of the VCO is counted, and output a high signal when the clock signal of the VCO is not counted.

The pulse signal generating unit may include a fourth flip-flop for outputting a logic signal according to monitoring result of the VCO clock monitoring unit; and a one-shot pulse signal generating unit for generating a one-shot pulse signal at a time when the fourth flip-flop outputs a low signal.

The one-shot pulse signal generating unit may generate the one-shot pulse signal using a delay cell and an OR gate.

The pulse signal generating unit may output a VCO enable signal for reoperating the VCO only when the PLL circuit is enabled.

The VCO enable signal may be output only during a period of the one-shot pulse signal.

The VCO enable signal may become low during a period of the one-shot pulse signal and become high again.

The VCO normally may output a clock signal when the VCO enable signal becomes high again.

The control signal generating unit may generate a VCO counter enable signal applied to the VCO clock monitoring unit and a detector clock signal applied to the pulse signal generating unit by using a reference clock signal externally supplied.

The control signal generating unit may supply the VCO counter enable signal to a first flip-flop and a second flip-flop of the VCO clock monitoring unit.

The control signal generating unit may include a counter for receiving the reference clock signal; a third flip-flop for generating the VCO counter enable signal through a clock signal multiplied by N by the counter; an inverter for converting the clock signal multiplied by N of the counter; and an AND gate for outputting the detector clock signal using the VCO counter enable signal and an output signal of the inverter.

Flip-flops provided in the VCO clock monitoring unit, control signal generating unit, and pulse signal generating unit may be D flip-flops.

In another aspect of the present disclosure, a phase locked loop (PLL) circuit includes a phase frequency detector, a charge pump, a loop filter, a voltage controlled oscillator (VCO), a divider, and a deadlock recovery unit, wherein the deadlock recovery unit comprises a VCO clock monitoring unit for monitoring a clock signal of the VCO; a pulse signal generating unit for outputting a one-shot pulse signal to reset the VCO if the clock signal is not counted; and a control signal generating unit for generating a VCO counter enable signal applied to the VCO clock monitoring unit and a detector clock signal applied to the pulse signal generating unit by using a reference clock signal externally supplied.

The pulse signal generating unit may output a VCO enable signal for reoperating the VCO only when the PLL circuit is enabled.

The VCO enable signal may be output only during a period of the one-shot pulse signal.

The VCO enable signal may become low during a period of the one-shot pulse signal.

In a further aspect of the present disclosure, a deadlock recovery method includes outputting a VCO clock signal by the VCO included in a PLL circuit; monitoring the VCO clock signal by a deadlock recovery unit; and outputting a VCO enable signal to the VCO by the deadlock recovery unit when the VCO clock signal is maintained in a high or low state.

The deadlock recovery method may further include receiving, by the deadlock recovery unit, a reference clock signal from outside after the outputting of the VCO clock signal.

The VCO may regenerate a VCO clock signal having a predetermined period when the VCO enable signal in a low state is applied.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The terms indicating a part such as "part" or "portion" used in the present description mean that the component may represent a device that may include a particular function, a software that may include a particular function, or a combination of a device and software that may include a particular function, but it cannot be said to be limited to the functions expressed. This is provided only to help a more general understanding of the present description and those of ordinary skill in the art may make various modifications and variations from these descriptions.

In addition, all electrical signals used in the present description, as an example, should be noted that signs of all electrical signals to be described below may be reversed when an inverter, etc., is additionally provided in the circuit of the present description. Thus, the scope of the present description is not limited to the direction of the signal.

Hence, the spirit of the present description should not be limited to the described embodiments or examples. Not only the claims described later but all equivalent or equivalent modifications to these claims belong to the scope of the present description.

Hereinafter, the present disclosure is described in more detail based on the example illustrated in the drawings.

The present disclosure relates to a deadlock recovery circuit and a deadlock recovery method that monitors the operation state of a voltage controlled oscillator (VCO) provided in a phase locked loop (PLL) circuit and reoperates the VCO in a short period of time when the VCO operates abnormally.

The present disclosure relates to a PLL circuit including a deadlock recovery circuit allows to quickly reoperate a VCO operating abnormally such that a frequency is normally generated.

Figure 1:
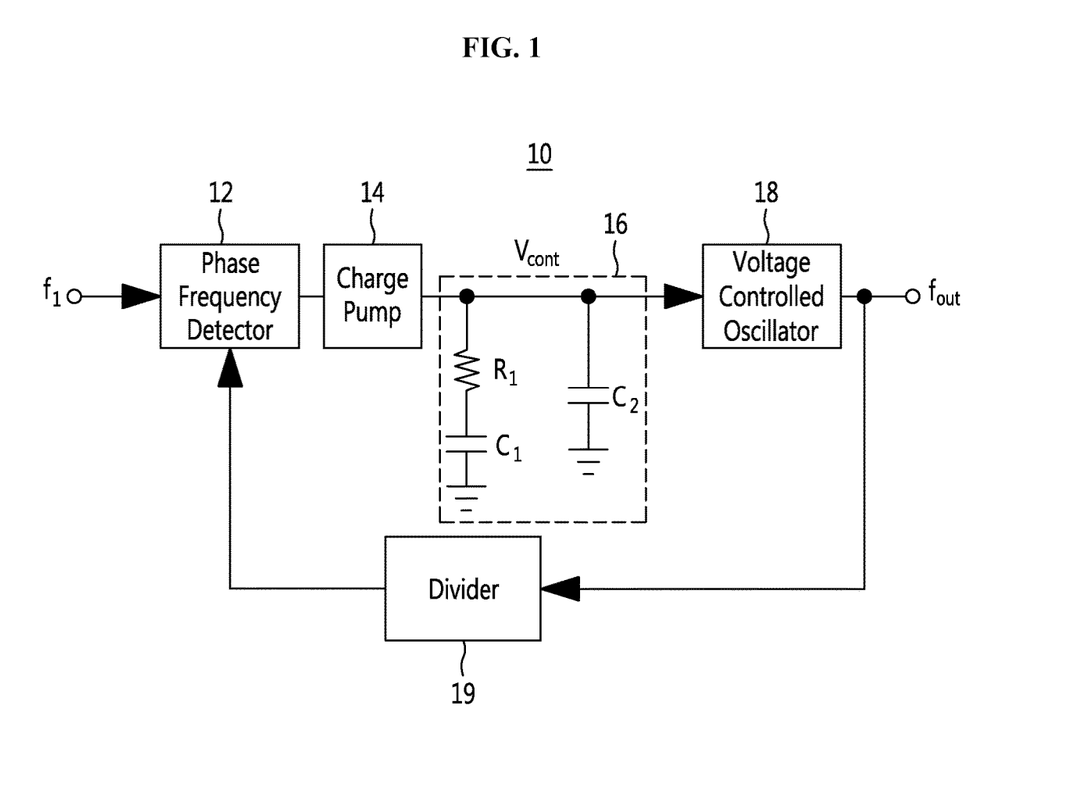
FIG. 1 illustrates a CPPLL circuit diagram.

FIG. 1 illustrates configuration of a Charge Pump Phase Locked Loop (CPPLL) circuit. The CPPLL circuit of FIG. 1 is a circuit that generates and outputs an output frequency (fout) by increasing a reference frequency (f1) by a multiple of M. The CPPLL circuit includes a Phase Frequency Detector (PFD) 12, a Charge Pump (CP) 14, a Loop Filter 16, a Voltage-Controlled Oscillator (VCO) 18, and a divider 19. With this configuration, the PLL circuit may continuously generate waveforms of a specific period.

Figure 2:
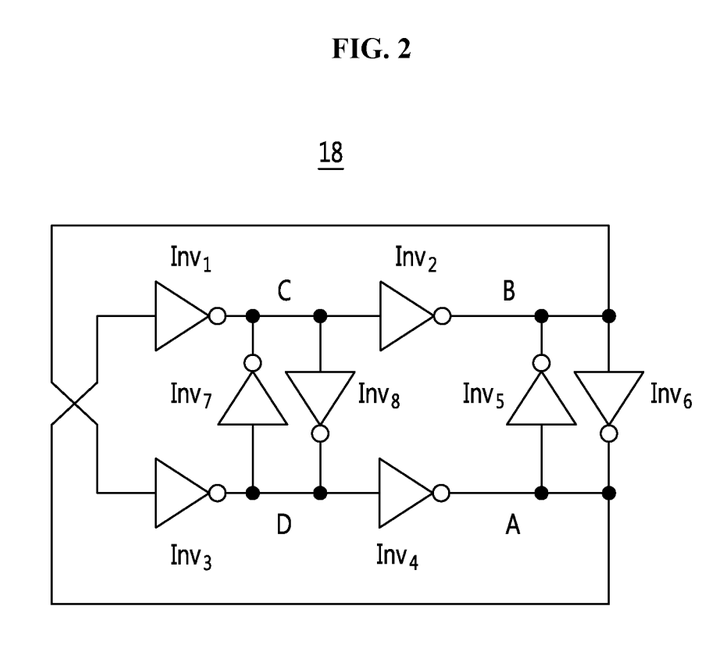
FIG. 2 illustrates an internal circuit diagram of an inverter-type differential VCO used in a PLL circuit.

FIG. 2 illustrates an internal circuit diagram of an inverter-type differential VCO used in the PLL circuit. As illustrated in FIG. 2, the VCO 18 includes a plurality of inverters Inv1~Inv8. In this circuit configuration, for example, if the output C of Inv1 is in a high state, the output B of Inv2 or the output D of Inv8 should be in the opposite low state.

Figure 3:
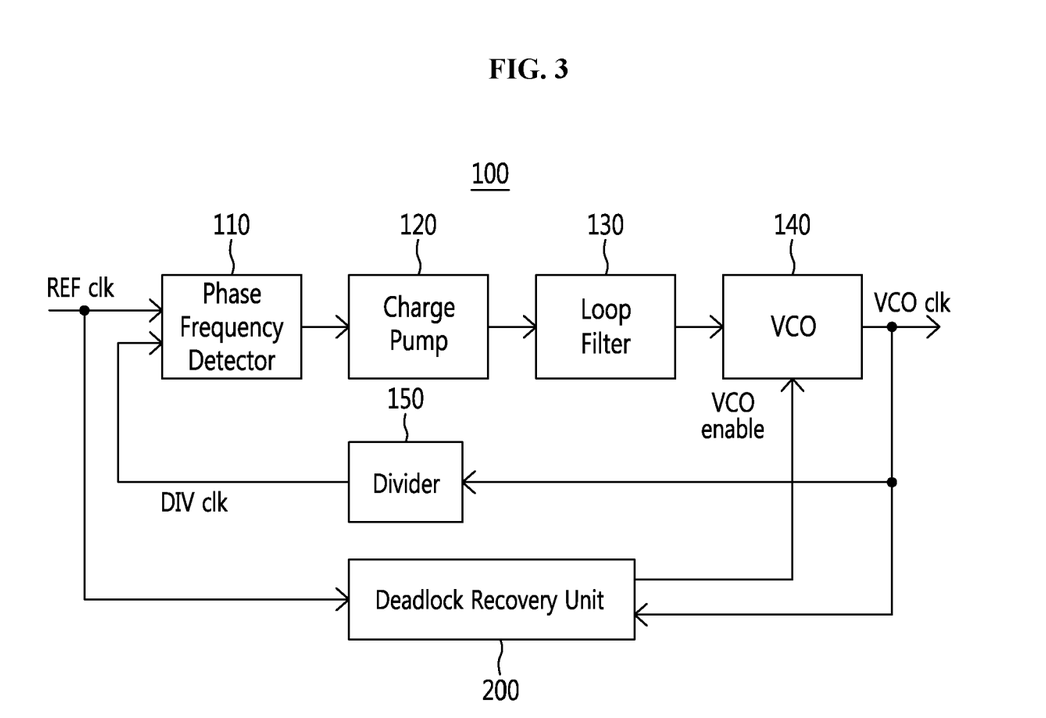
FIG. 3 illustrates a configuration diagram of a PLL circuit according to an example of the present disclosure.

FIG. 3 illustrates a configuration diagram of a PLL circuit according to an example of the present disclosure.

As illustrated in FIG. 3, the PLL circuit 100 includes a phase frequency detector (PFD) 110, a charge pump (CP) 120, a loop filter 130, a voltage controlled oscillator (VCO) 140, a divider 150, and a deadlock recovery unit 200.

The phase frequency detector 110 compares a reference clock (REF clk) with a clock (DIV clk) divided from the divider 150 and outputs a pulse corresponding to the difference.

The charge pump 120 outputs a current proportional to the pulse width of the phase frequency detector 110.

The loop filter 130 may have the structure of a low pass filter including resistance (R) and capacitor (C) elements, for example, filters out high-frequency components generated during loop operation, and applies voltage to VCO 140 through changes in charge accumulated using the capacitor (C).

The VCO 140 outputs a VCO clock (VCO clk) according to a level change of a voltage output from the loop filter 130.

The divider 150 divides the VCO clock (VCO clk) of the VCO by an arbitrary ratio (N) to output a divided clock signal (DIV clk). The DIV clk signal is supplied to the phase frequency detector 110.

When the VCO clock signal (VCO clk) of the VCO 140 continues to be output in a high or low state, the deadlock recovery unit 200 outputs the VCO enable signal in a low state for a certain period of time to reoperate the VCO 140. Unlike the PLL circuit of FIG. 1, the present disclosure may further include such a deadlock recovery unit 200. Specifically, the deadlock recovery unit 200 detects whether the VCO clock signal of the VCO 140 is output normally using an externally applied reference clock signal, and applies a one-shot pulse signal to reoperate the VCO 140.

Figure 4:
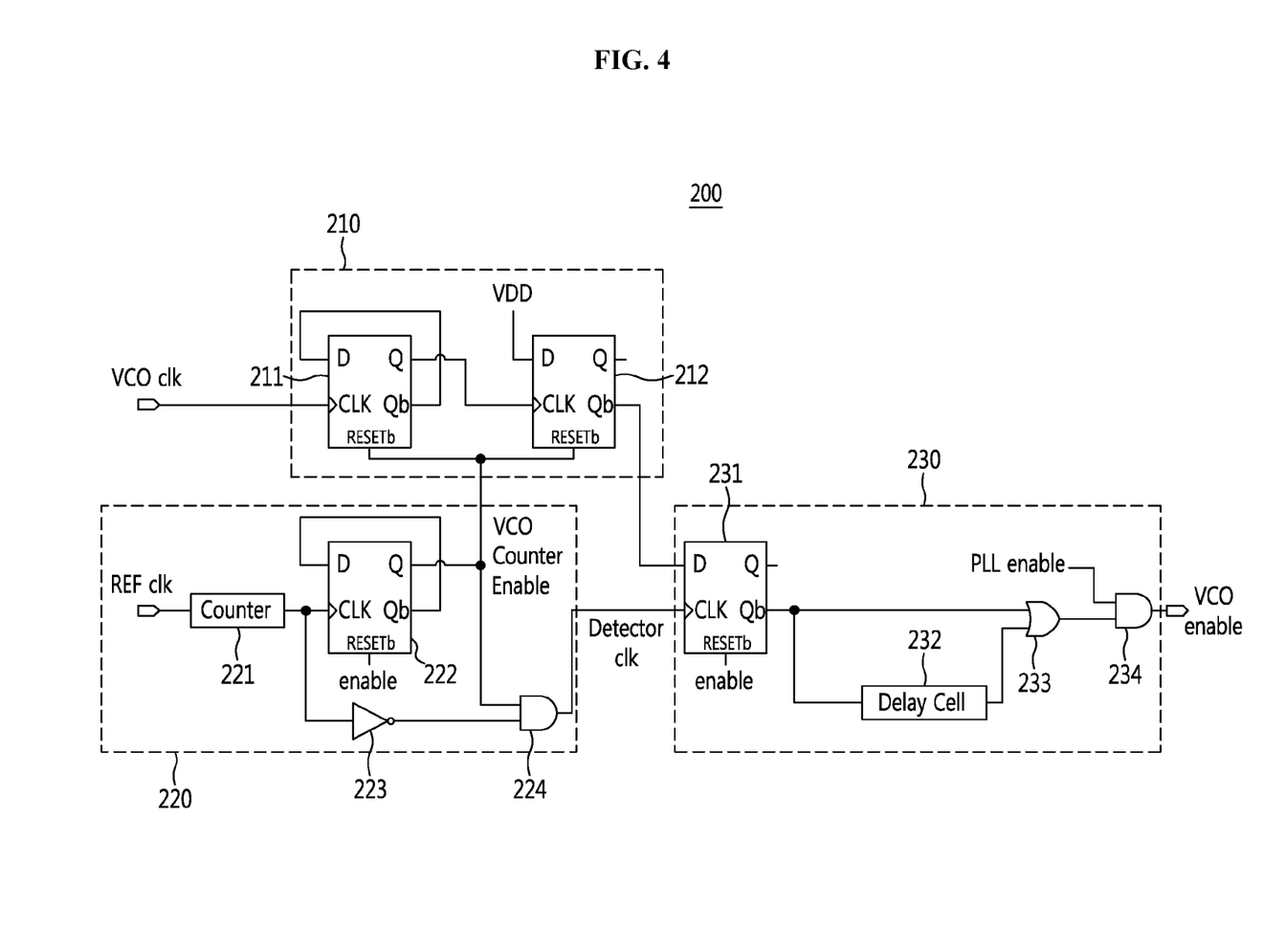
FIG. 4 illustrates a circuit configuration diagram of the deadlock recovery unit of FIG. 3.

FIG. 4 illustrates a circuit configuration diagram of the deadlock recovery unit of FIG. 3.

The deadlock recovery unit 200 is operated under conditions in which the PLL circuit 100 is driven. Since the deadlock recovery unit 200 uses a reference clock (REF clk) signal to drive the PLL circuit 100, if the reference clock signal (REF clk) is unauthorized and the PLL circuit 100 does not operate, the deadlock recovery unit 200 cannot operate.

Referring to FIG. 4, the deadlock recovery unit 200 consists of a VCO clock monitoring unit 210, a control signal generating unit 220, and a pulse signal generating unit 230.

The VCO clock monitoring unit 210 is a unit that monitors whether the VCO clock signal is output from the VCO 140, and consists of two logical devices for counting the VCO clock signal (VCO clk). Specifically, the two logical elements may be a first D flip-flop 211 and a second D flip-flop 212, which are delay-type flip-flops. The first D flip-flop 211 is a flip-flop that counts a VCO clock signal. The second D flip-flop 212 is configured to output a high signal or a low signal through the Qb output terminal according to the VCO counter enable signal (VCO Counter Enable) and the VCO clock (VCO clk). In other words, the second D flip-flop 212 outputs a low signal through the Qb output terminal when the VCO clock signal is normally output while the VCO counter enable signal outputs a high signal. On the other hand, the second D flip-flop 212 outputs a high signal through the Qb output terminal when the VCO clock signal is abnormally output while the VCO counter enable signal outputs a high signal.

The control signal generating unit 220 generates a VCO counter enable signal that enables the first D flip-flop 211 and the second D flip-flop by inputting a reference clock signal (REF clk), externally supplied, to drive the PLL circuit 100. It also generates a detector clock signal (Detector clk) provided to the pulse signal generating unit 230.

The control signal generating unit 220 may include a counter 221 that receives a reference clock signal (REF clk), a third D flip-flop 222 that generates the VCO counter enable (VCO Counter Enabler) signal multiplied by the counter 221, an inverter 223 that change and outputs the clock signal multiplied by the counter 221, and a first AND gate 224 that outputs the detector clock (Detector clk) using the VCO counter enable signal and the output signal of the inverter.

The pulse signal generating unit 230 may generate a one-shot pulse signal when the VCO clock signal is abnormally output, which is deadlock situation, and outputs the VCO enable signal in a low-level state during the period in which the one-shot pulse signal is generated to reoperate the VCO 140.

According to the present disclosure, the pulse signal generating unit 230 may include a fourth D flip-flop 231 that outputs a detection signal according to a deadlock state, a delay cell 232 and an OR gate 233 to generate a one-shot pulse signal when detecting a deadlock, and a second AND gate 234 that outputs a VCO enable signal to reoperate the VCO 140. Here, the elements constituting the delay cell 232 may be inverters, but may be comprised of various other elements. In other words, it may be comprised of elements capable of generating pulse signals by providing delay times.

The pulse signal generating unit 230 having such configuration outputs a one-shot pulse signal when the Qb output terminal of the fourth D flip-flop 231 is changed from a high state to a low state and outputted, and enables the VCO 140 to be reoperated by the one-shot pulse signal. Reoperation of the VCO 140 is possible by making the VCO enable signal low for a predetermined period of time and then changing it back to a high state. At this time, when the VCO Enable signal becomes low, the output voltage of the VCO 140 is reset to VDD and ground (GND), so when the VCO enable signal becomes high again, the VCO clock signal (VCO clk) is normally output.

A deadlock recovery process of the VCO according to an example of the present disclosure with such a configuration is as follows.

The PLL circuit 100 is provided in a predetermined system to generate a frequency required by the system, thereby allowing the system to operate normally.

Since the first D flip-flop 211 and the second D flip-flop 212 of the VCO clock monitoring unit 210 are normally driven by the VCO counter enable signal while the PLL circuit 100 is running, it is possible to monitor as to whether the VCO clock signal (VCO clk) is output from the VCO 140.

Accordingly, the first D flip-flop 211 counts the VCO clock signal (VCO clk), and the counting result of the first D flip-flop 211 is transmitted to and monitored by the second D flip-flop 212. The monitoring process is to detect whether the output signal of the first D flip-flop 211 is counted for a certain period of time while the second D flip-flop 212 receives a logic high signal (VDD) through the D input terminal and the output signal of the first D flip-flop 211 through a clock terminal.

Then, according to the monitoring results of the second D flip-flop 212, the fourth D flip-flop 231 of the pulse signal generating unit 230 allows the one-shot pulse signal to be selectively output while receiving the detector clock signal (Detector clk). Specifically, the fourth D flip-flop 231 receives a monitoring signal of the second D flip-flop 212 through the D input terminal. According to the monitoring signal result, when a deadlock occurs in which the VCO clock signal (VCO clk) continues to remain high or low, the fourth D flip-flop 231 outputs a low state signal through the Qb output terminal. On the other hand, when the VCO clock signal (VCO clk) is normal, the Qb output terminal of the fourth D flip-flop 231 outputs a high-state signal.

When the fourth D flip-flop 231 outputs a low-state signal, a one-shot pulse signal is generated using a delay cell 232 and an OR gate 233. In addition, the VCO enable signal (VCO enable) becomes low only during the period in which the generated one-shot pulse signal is low.

As the VCO enable signal (VCO enable) becomes low, the VCO 140 operates again, and the VCO clock signal is normally output outside the deadlock state in which the VCO 140 signal continues to remain high or low. As a result, the PLL circuit 100 may operate normally.

FIGS. 5A to 5J illustrate timing diagrams of a VCO deadlock recovery process according to one example of the present disclosure.

Figures 5A, 5B, 5C, 5D:
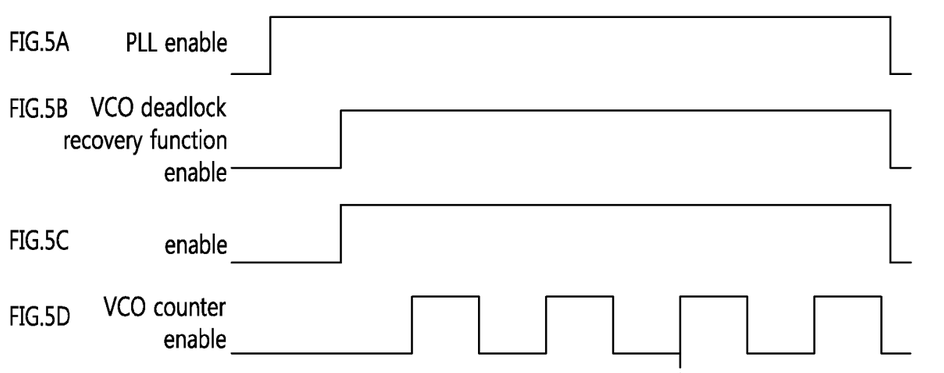
FIGS. 5A-5J illustrate a timing diagram of a VCO deadlock recovery process according to one example of the present disclosure.

FIG. 5A represents an enable signal that drives the PLL circuit 100, FIG. 5B represents an enable signal that activates a deadlock recovery function of the present disclosure, and FIG. 5C represents an enable signal that enables the deadlock recovery function to be performed. In this way, under the condition that an enable signal of the PLL circuit of FIG. 5A is high and an enable signal for activating the deadlock recovery function of FIG. 5B is high, an enable signal FIG. 5C for operating VCO 140 again becomes high to perform the deadlock recovery process. If either the PLL enable signal of FIG. 5A or the enable signal of FIG. 5B is low, the deadlock recovery function may not be performed.

In FIG. 5D, a VCO counter enable signal (VCO count enable) is a signal for enabling a first D flip-flop 211 and a second D flip-flop 212 provided in the VCO clock monitoring unit 210. In other words, the control signal generating unit 220 multiplies a reference clock signal (REF clk), externally supplied, at the counter 221, and then outputs a VCO counter enable signal through the third D flip-flop 222 to apply it to the first D flip-flop 211 and the second D flip-flop 212. Therefore, while the VCO counter enable signal of FIG. 5D operates at a predetermined period, the first D flip-flop 211 and the second D flip-flop 212 also operates at a predetermined period.

Figure 5E:
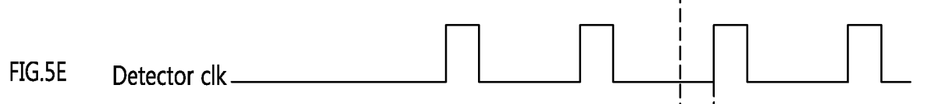

In FIG. 5E, the signal is a detector clock signal (Detector clk) applied to the fourth D flip-flop 231. The detector clock signal is designed such that a rising edge is generated during a high period of the VCO counter enable signal. In other words, as shown in FIG. 5E, the VCO clock monitoring unit 210 is in a high state until reset, and this detector clock signal may be said to be a signal for performing the operation of the fourth D flip-flop 231.

Figures 5F, 5G:
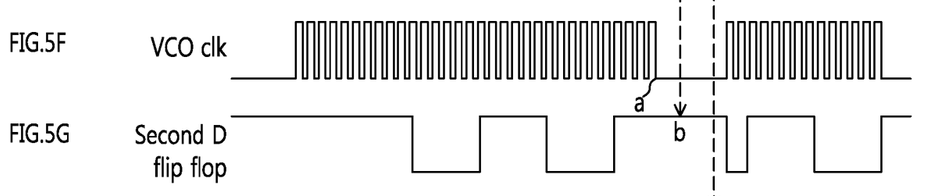

In this way, while the first D flip-flop 211, second D flip-flop 212, and fourth D flip-flop 231 are operating normally, the VCO clock signal (VCO clk) shown in FIG. 5F is output. The first D flip-flop 211 counts the VCO clock signal output in this way, and the second D flip-flop 212 receives the count result. In this case, if the VCO clock signal (VCO clk) is continuously output after the time point 'a', it is in a normal state.

However, as shown in FIG. 5F, if the VCO clock signal (VCO clk) is not generated after the time 'a' (i.e., an external impact such as ESD is applied to the circuit at the time 'a'), the first D flip-flop 211 cannot count the VCO clock signal. Therefore, in FIG. 5G, an output signal through the Qb output terminal of the second D flip-flop 212 should be low at the time 'b', but it continues to be high. That is, a deadlock occurs in which the VCO clock signal maintains a high state or a low state. Therefore, as shown in FIG. 5H, at the time of deadlock, the output signal through the Qb output terminal of the fourth D flip-flop 231 becomes low at the rising edge point 'c' of the detector clock signal (Detector clk).

Figures 5H, 5I:
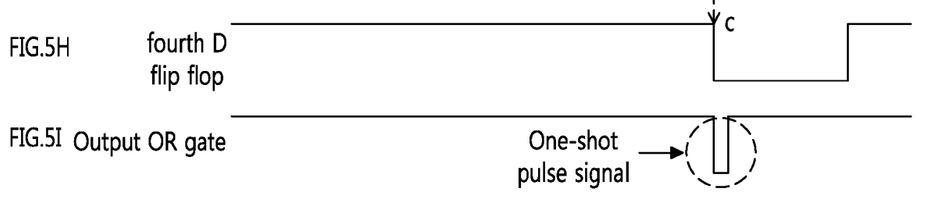
Figure 5J:
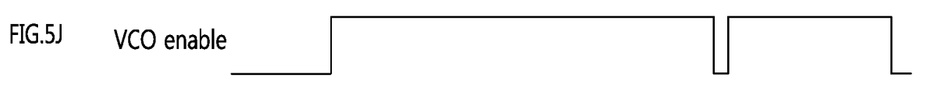

In this way, when the fourth D flip-flop 231 outputs a low-state signal, the OR gate 233 of the pulse signal generating unit 230 generates a low-state one-shot pulse signal at the time of 'c' as shown in FIG. 5I. When a one-shot pulse signal is generated, the VCO enable signal becomes low only during a period in which the one-shot pulse signal is generated. Therefore, according to the VCO enable signal (VCO enable), the VCO 140 may reoperate, and the VCO 140 may normally output the VCO clock signal (VCO clk) again as shown in FIG. 5J.

In this way, if the VCO 140 provided in the PLL circuit 100 fails to output a clock signal normally, it detects and outputs a one-shot pulse signal to make the VCO 140 reoperate, and as a result, the PLL circuit 100 may also operate normally to generate a specific frequency.

According to the present disclosure, a voltage controlled oscillator may be restored within a short period of time by detecting an abnormal operating state in which a clock signal of the voltage controlled oscillator does not operate and by applying a one-shot pulse signal to reoperate the voltage controlled oscillator, and thus the PLL circuit may also be operated normally within a short period of time.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A deadlock recovery circuit, comprising:
   a voltage controlled oscillator (VCO) clock monitoring unit configured to monitor a clock signal of a VCO;
   a pulse signal generating unit configured to output a one-shot pulse signal to reset the VCO if the clock signal is not counted; and
   a control signal generating unit configured to control the VCO clock monitoring unit and the pulse signal generating unit using a reference clock signal externally supplied,
   wherein the pulse signal generating unit is configured to output a VCO enable signal in a low state for a certain period of time to the VCO when the clock signal of the VCO continuously remains in a high or low state.

2. The deadlock recovery circuit of claim 1, wherein the VCO clock monitoring unit is controlled by a VCO counter enable signal generated from the control signal generating unit.

3. The deadlock recovery circuit of claim 2, wherein the VCO clock monitoring unit includes:
   a first flip-flop for counting the clock signal of the VCO; and
   a second flip-flop for outputting a logic signal according to an output signal of the first flip-flop, and
   wherein the second flip-flop, while the VCO counter enable signal is in a high state, outputs the low signal when the clock signal of the VCO is counted, and outputs the high signal when the clock signal of the VCO is not counted.

4. The deadlock recovery circuit of claim 1, wherein the pulse signal generating unit includes:
   a fourth flip-flop for outputting a logic signal according to monitoring result of the VCO clock monitoring unit; and
   a one-shot pulse signal generating unit for generating a one-shot pulse signal at a time when the fourth flip-flop outputs a low signal.

5. The deadlock recovery circuit of claim 4, wherein the one-shot pulse signal generating unit generates the one-shot pulse signal using a delay cell and an OR gate.

6. The deadlock recovery circuit of claim 5, wherein the pulse signal generating unit outputs a VCO enable signal for reoperating the VCO only when the PLL circuit is enabled.

7. The deadlock recovery circuit of claim 6, wherein the VCO enable signal is output only during a period of the one-shot pulse signal.

8. The deadlock recovery circuit of claim 7, wherein the VCO enable signal becomes low during a period of the one-shot pulse signal and becomes high again.

9. The deadlock recovery circuit of claim 8, wherein the VCO normally outputs a clock signal when the VCO enable signal becomes high again.

10. The deadlock recovery circuit of claim 1, wherein the control signal generating unit generates a VCO counter enable signal applied to the VCO clock monitoring unit and a detector clock signal applied to the pulse signal generating unit by using a reference clock signal externally supplied.

11. The deadlock recovery circuit of claim 10, wherein the control signal generating unit supplies the VCO counter enable signal to a first flip-flop and a second flip-flop of the VCO clock monitoring unit.

12. The deadlock recovery circuit of claim 10, wherein the control signal generating unit includes:
    a counter for receiving the reference clock signal;
    a third flip-flop for generating the VCO counter enable signal through a clock signal multiplied by N by the counter;
    an inverter for converting the clock signal multiplied by N of the counter; and
    an AND gate for outputting the detector clock signal using the VCO counter enable signal and an output signal of the inverter.

13. The deadlock recovery circuit of claim 10, wherein flip-flops provided in the VCO clock monitoring unit, control signal generating unit, and pulse signal generating unit are D flip-flops.

14. A phase locked loop (PLL) circuit, comprising:
    a phase frequency detector, a charge pump, a loop filter, a voltage controlled oscillator (VCO), a divider, and a deadlock recovery unit,
    wherein the deadlock recovery unit comprises:
    a VCO clock monitoring unit for monitoring a clock signal of the VCO;
    a pulse signal generating unit for outputting a one-shot pulse signal to reset the VCO if the clock signal is not counted; and
    a control signal generating unit for generating a VCO counter enable signal applied to the VCO clock monitoring unit and a detector clock signal applied to the pulse signal generating unit by using a reference clock signal externally supplied,
    wherein the pulse signal generating unit is configured to output a VCO enable signal in a low state for a certain period of time to the VCO when the clock signal of the VCO continuously remains in a high or low state.

15. The PLL circuit of claim 14, wherein the pulse signal generating unit outputs a VCO enable signal for reoperating the VCO only when the PLL circuit is enabled.

16. The PLL circuit of claim 15, wherein the VCO enable signal is output only during a period of the one-shot pulse signal.

17. The PLL circuit of claim 15, wherein the VCO enable signal becomes low during a period of the one-shot pulse signal.

18. A deadlock recovery method, comprising:
outputting a voltage controlled oscillator (VCO) clock signal by the VCO included in a PLL circuit;
monitoring the VCO clock signal by a deadlock recovery unit; and
outputting a low VCO enable signal for a certain period of time to the VCO by the deadlock recovery unit when the VCO clock signal continuously remains in a high or low state.

19. The deadlock recovery method of claim 18, further comprising receiving, by the deadlock recovery unit, a reference clock signal from outside after the outputting of the VCO clock signal.

20. The deadlock recovery method of claim 19, wherein the VCO regenerates a VCO clock signal having a predetermined period when the VCO enable signal in a low state is applied.

* * * * *